(12) United States Patent
Lam et al.

(10) Patent No.: US 8,022,516 B2
(45) Date of Patent: Sep. 20, 2011

(54) METAL LEADFRAME PACKAGE WITH SECURE FEATURE

(75) Inventors: Ken Lam, Colorado Springs, CO (US); Julius Andrew Kovats, Manitou Springs, CO (US)

(73) Assignee: Atmel Corporation, San Jose, CA (US)

( * ) Notice: Subject to any disclaimer, the term of this patent is extended or adjusted under 35 U.S.C. 154(b) by 268 days.

(21) Appl. No.: 12/191,214

(22) Filed: Aug. 13, 2008

(65) Prior Publication Data

US 2010/0038760 A1    Feb. 18, 2010

(51) Int. Cl.
*H01L 23/495* (2006.01)

(52) U.S. Cl. ......... 257/676; 257/E23.039; 257/E23.114; 257/696; 257/698; 257/691; 257/211; 257/208; 257/202; 257/796; 257/684; 257/666; 257/685; 257/787

(58) Field of Classification Search .................. 257/666, 257/676, 690, 686, 787, E23.114, E23.039, 257/696, 698, 691, 208, 211, 202, 203, 684, 257/796; 438/123

See application file for complete search history.

(56) References Cited

U.S. PATENT DOCUMENTS

| 6,294,100 | B1 * | 9/2001 | Fan et al. .................. 216/14 |
| 6,664,615 | B1 | 12/2003 | Bayan et al. |
| 7,741,158 | B2 * | 6/2010 | Leung et al. ............... 438/122 |
| 2003/0085459 | A1 | 5/2003 | Akram et al. |
| 2005/0006737 | A1 * | 1/2005 | Islam et al. ................ 257/676 |
| 2005/0101055 | A1 * | 5/2005 | Kasahara et al. ............ 438/106 |
| 2006/0170081 | A1 | 8/2006 | Gerber et al. |
| 2008/0003718 | A1 | 1/2008 | Estepa et al. |

FOREIGN PATENT DOCUMENTS

JP    2010-8-883    *    4/2010

* cited by examiner

*Primary Examiner* — A Williams
(74) *Attorney, Agent, or Firm* — Fish & Richardson P.C.

(57) ABSTRACT

A fabrication method for a BGA or LGA package includes a low-cost metal leadframe with internally extended leads. I/O attach lands can be placed at any location on the metal leadframe, including the center of the package. An I/O attach land can be fabricated at any position upon an extended lead (e.g., near the center of the package). During fabrication of the package, an isolation saw cut to the bottom of the package can be used to electrically disconnect the leadframe circuit from the peripheral extension traces to prevent tampering with the IC die by probing the edge metal traces.

15 Claims, 4 Drawing Sheets

METAL LEADFRAME PACKAGE WITH SECURE FEATURE

TECHNICAL FIELD

This subject matter is generally related to lead frame based integrated circuit (IC) packages.

BACKGROUND

Grid array packages, such as the Ball Grid Array (BGA) and Land Grid Array (LGA) package layouts provide a surface mount integrated circuit (IC) with a high density of input/output (I/O) connections. The LGA package solution uses contact pads, while the BGA package solution includes solder balls for attachment (e.g., to a printed circuit board (PCB)).

Conventional BGA and LGA package fabrication involves wire bond or flip-chip connection of an IC die to an organic interposer substrate. Custom circuit routing and package I/O layout are available using the organic interposer substrate solution. However, the manufacturing process and materials involved in the organic interposer substrate solution are costly. Also, packages fabricated with an organic interposer substrate have a higher Moisture Sensitivity Level (MSL) than metal leadframe based packages due to the organic substrate's hygroscopic property. In some cases, this leads to handling requirements such as storage within vacuum sealed moisture barrier bags and limited shelf life prior to assembly.

A BGA or LGA package can instead be fabricated upon an etched or stamped leadframe. The leadframe structure, commonly a metal (e.g., copper) strip, includes a die-attach paddle (DAP) at the center of the package. The DAP shifts the I/O connection placement to the periphery of the package. Because the I/O connections are arranged at the periphery of the package, metal leadframe BGA and LGA packages are less tamper resistant. For example, signals at the edges of the BGA and LGA package can easily be probed because they are exposed upon singulation of the package.

The I/O attach lands are supported by and connected to a plating bus frame. The cantilever connection of the attach lands to the plating bus frame limits the distance an attach land can be placed from the plating bus frame. The limitations on the placement of the attach lands can also limit the IC die size range which can be used in the package. For example, if an IC die is small, the wire bonding connections may be sufficiently long to cause wire sweep defects in the molding stage of fabrication.

SUMMARY

A BGA or LGA package includes a low-cost metal leadframe with internally extended leads to provide a flexible IC package with built in tamper resistance. I/O attach lands can be placed at any location on the metal leadframe, including the center of the package. An I/O attach land can be fabricated at any position upon an extended lead (e.g., near the center of the package). The extended lead and the I/O attach land are formed from a single metal trace. During fabrication of the package, an isolation saw cut to the bottom of the package can be used to electrically disconnect the leadframe circuit from the peripheral extension traces to prevent tampering with the IC die by probing the edge metal traces.

The disclosed implementations provide several advantages over convention BGA and LGA packages. For a similar body-size package, a BGA or LGA package based upon the metal leadframe with internally extended leads may cost about one-third to one-half less than the conventional BGA or LGA packages which use an organic interposer substrate. Because the internally extended leads extend beneath the IC die, wire bonds can be positioned at any point adjacent to the IC die. This allows the use of a wide range of die sizes without increasing the chance of manufacturing defect. Once the assembled package has been mounted (e.g., to a PCB), it would be difficult to probe underneath the package to access the connection signals for tampering.

DETAILED DESCRIPTION

Example Leadframe Design

Figure 1A:
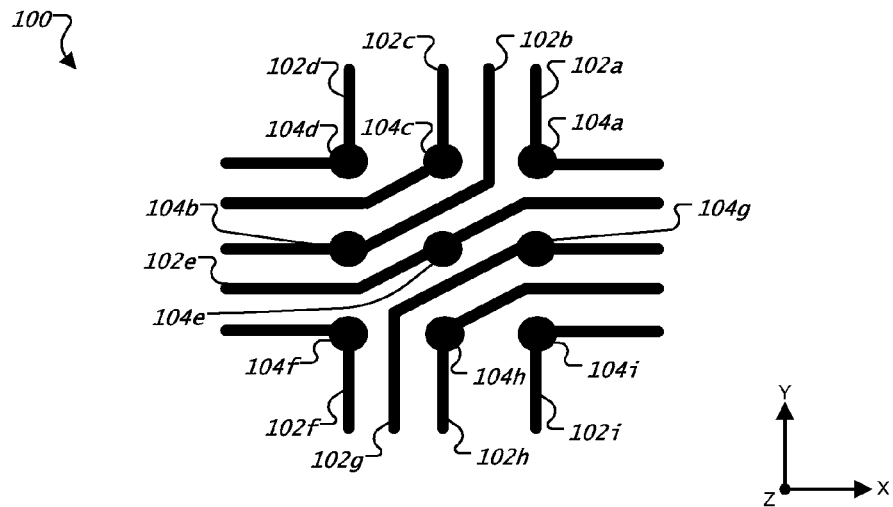
FIGS. 1A through 1C illustrate an example leadframe design with internally extended package leads.
Figure 1B:
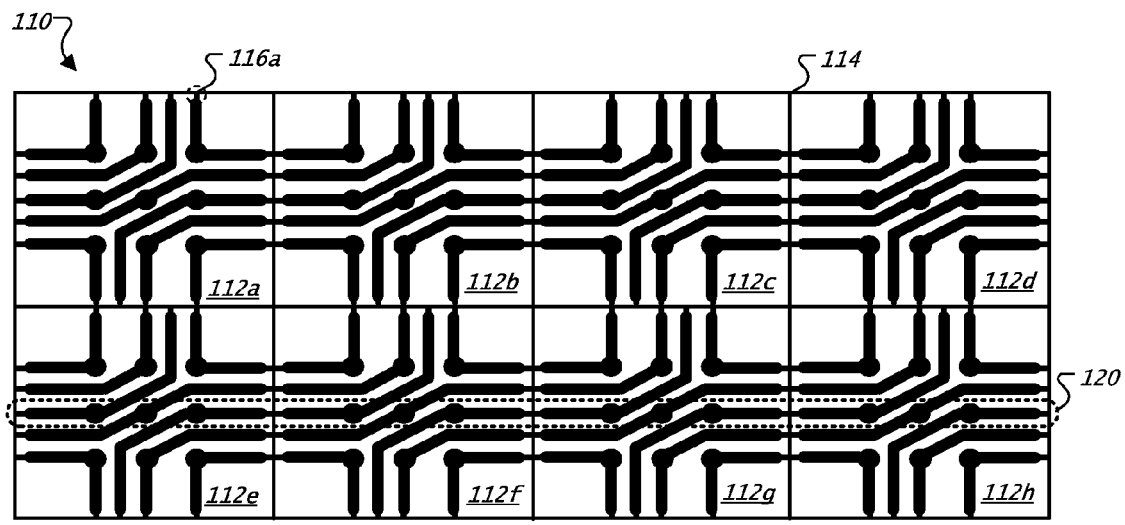
Figure 1C:

FIGS. 1A through 1C illustrate an example leadframe cell 100 with internally extended package leads. The leadframe cell 100 can be used, in some implementations, as the base for fabricating a BGA or LGA IC package. The leadframe cell 100, for example, can be fabricated using standard leadframe fabrication methods. The leadframe cell 100, in some examples, can be fabricated using copper, copper alloy, aluminum, brass, or iron-nickel alloy.

As shown in FIG. 1A, the leadframe cell 100 can include a number of extended package leads 102 arranged in a plane along a first axis of the plane (e.g., a y-axis). The extended package leads 102 include attach lands 104. The attach lands 104 can be positioned anywhere along the length of the extended package lead 102. Each extended package lead 102, including the incorporated attach land 104, includes a continuous metal trace. Lead ends of the extended package leads 102 can extend along the first axis of the plane and/or a second axis of the plane that is substantially orthogonal to the first axis of the plane (e.g., an x-axis). The extended package leads 102 can provide flexible connection options when electrically connecting an IC die to the leadframe cell 100 during assembly of a package.

In the configuration shown, the leadframe cell 100 includes four extended package leads 102a, 102d, 102f, and 102i with orthogonal lead ends. The extended package leads 102a, 102d, 102f, 102i form right angles with attach lands 104a, 104d, 104f, 104i positioned at the apices. The leadframe cell 100 additionally includes four extended package leads 102b, 102c, 102g, and 102h with orthogonal lead ends. The attach land 104c is positioned between the attach lands 104d and 104a along the second axis, and the attach land 104h is positioned between the attach lands 104f and 104i along the second axis (e.g., the x-axis). The attach land 104b is positioned between the attach lands 104d and 104f along the first axis, and the attach land 104g is positioned between the attach lands 104a and 104i along the first axis (e.g., the y-axis). The leadframe cell 100 includes the extended package lead 102e with parallel lead ends. The attach land 104e is centered upon the extended package lead 102e and centered between the other eight attach lands 104a, 104b, 104c, 104d, 104f, 104g, 104*h*, and 104*i*. The attach lands 104, for example, provide a connecting surface for attaching the package to additional circuitry (e.g., a PCB).

As shown in FIG. 1B, a top view 110 of a strip of eight leadframe cells 112 (e.g., fabricated in the pattern of the leadframe cell 100) are attached to a bus bar frame 114. The bus bar frame 114 stabilizes the extended package leads 102 of each individual leadframe cell 112 during the fabrication process. Upon completion of the B/LGA fabrication process, the individual leadframe cells 112 can be singulated along the bars of the bus bar frame 114. The bus bar frame 114, in some implementations, can provide structure for plating the extended package leads 102 and attach lands 104 (e.g., nickel-palladium-gold plating upon a copper leadframe). The plating (e.g., silver, gold, palladium, aluminum, etc.), for example, can be used in some implementations to improve the bonding and/or soldering connectivity of the extended package leads 102 and/or the leadframe attach lands 104.

Each extended package lead 102 is connected at both ends (e.g., at adjacent sides or opposite sides, depending upon the routing of the extended package lead 102) to the bus bar frame 114 with an optional neck-down section 116. The neck-down section 116 includes a narrow portion of the extended package lead 102 which is directly connected to the bus bar frame 114. The neck-down section 116, in some implementations, can decrease the effects of metal smearing during the singulation process of the leadframe packages.

As shown in FIG. 1C, a side view of the leadframe section 120 (as shown in FIG. 1B) illustrates the full leadframe thickness and reduced leadframe thickness portions of a section of the leadframe cells 112*e*, 112*f*, 112*g*, and 112*h*. For clarity, the bus bar frame 114 is omitted from the side view. The attach lands 104 (e.g., attach lands 104*b*, 104*e*, and 104*g* of leadframe cell 112*e*) are full leadframe thickness, while the extended package leads 102 (e.g., extended package leads 102*b* and 102*g* of leadframe cell 112*e*) are reduced to approximately half the leadframe thickness. The extended package leads 102, for example, can be reduced in thickness by etching the leadframe cells 112 from the bottom side to about half of the leadframe thickness. Reducing the thickness of the extended package leads 102 can aid in electrically isolating the attach land signals from the lead extension signals in a final product.

Example Assembly Steps

FIGS. 2A through 2G illustrate an example process for assembling a BGA or LGA package with a secure feature. In this example, a leadframe strip 200 includes four leadframe cells 202*a*, 202*b*, 202*c*, and 202*d* (e.g., fabricated using the leadframe cell design 100 as described in FIG. 1A). The leadframe strip 200 is fabricated on a bus bar frame 204.

Figure 2A:
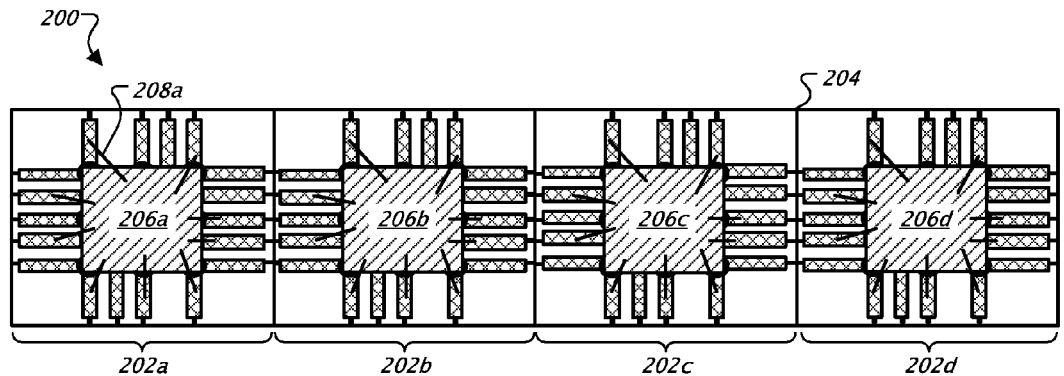
FIGS. 2A through 2G illustrate an example process for assembling a ball/land grid array package with a secure feature.

In FIG. 2A, an IC die 206 is attached to the top side of each leadframe cell 202, for example using a non-conductive die-attach adhesive (e.g., paste or film). To electrically connect the die 206 to the leadframe cell 202, wire bonds 208 (e.g., gold, aluminum, copper, or coated gold wire, etc.) are formed between the bond pads of the die 206 and the extended package leads (e.g., package leads 102 of leadframe cell 100 as shown in FIG. 1) of the leadframe cell 202. The wire bonds 208 (e.g., wire bond 208*a*) can be attached using traditional wire bonding techniques. Because the extended package leads 102 extend beneath the IC die 206, any size IC die can be attached to the leadframe cell 202 using short wire bonding connections, attaching the IC die 206 to the section of extended package lead 102 directly beyond the periphery of the IC die 206.

Figure 2B:
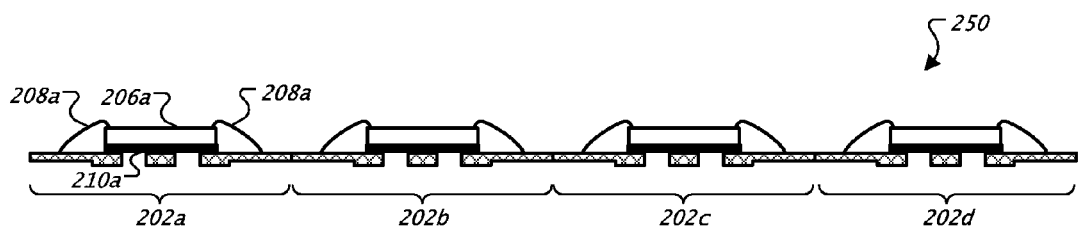

A side view 250 of the leadframe strip 200 is illustrated in FIG. 2B. For clarity, the bus bar frame 204 is omitted from the side view 250. The side view 250 shows wire bonds 208 connecting each IC die 206 to the corresponding leadframe cell 202 (e.g., the die 206*a* connects to the leadframe cell 202*a*). A die-attach adhesive 210 is illustrated layered beneath each IC die 206.

Figure 2C:
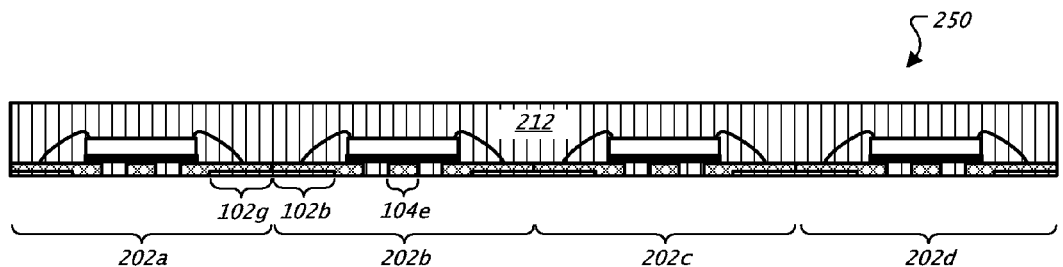

In FIG. 2C, the leadframe strip 200 is encapsulated with a mold compound 212 (e.g., plastic, ceramic, epoxy, etc.) and then cured. The cured hardened mold compound forms a rigid structure which holds the features of each leadframe cell 202 in position. The mold compound 212 encapsulates the portion of each leadframe cell 202 which has been etched to less than the leadframe thickness (e.g., extended package lead 102*g* of leadframe cell 202*a* and extended package lead 102*b* of leadframe cell 202*b*, etc.). The bottoms of the I/O attach lands 104 (e.g., attach land 104*e* of leadframe cell 202*b*) remain exposed.

Figure 2D:
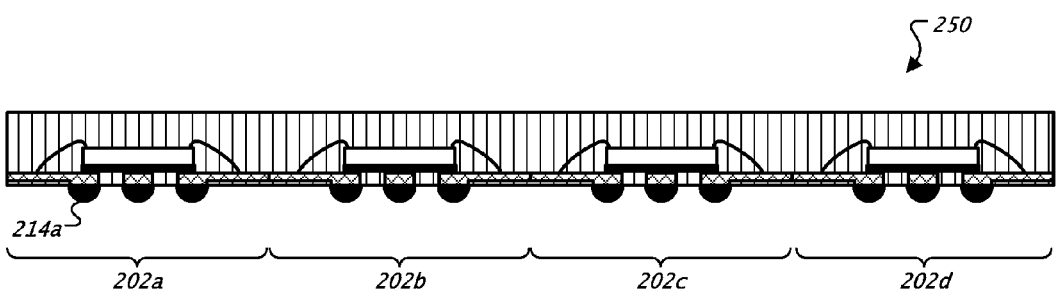

In FIG. 2D, solder balls 214 are optionally attached to the I/O attach lands 104 (e.g., when fabricating a BGA). The solder balls 214 can be deposited using any conventional solder bump fabrication technique.

Figure 2E:
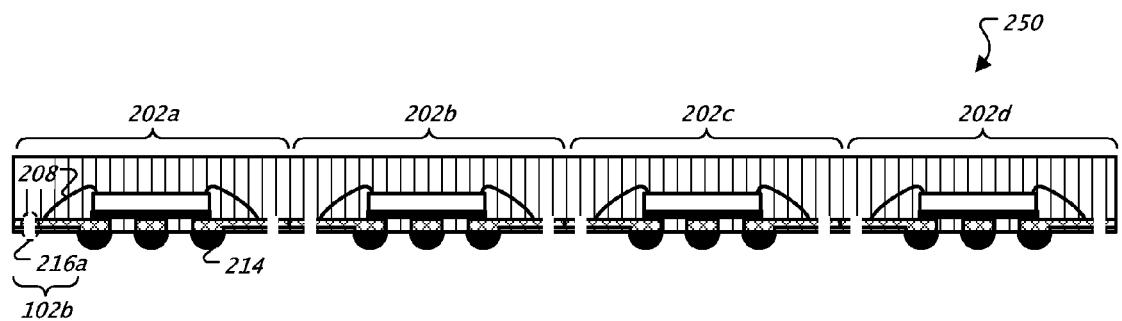

Prior to singulation, as shown in FIG. 2E, the leadframe cell 202 is severed beyond the position of the wire bond connections 208. Severing the leadframe 202 isolates the signals provided through the wire bonds 208 from the periphery of the leadframe package. A shallow saw cut 216 (e.g., cut 216*a* through extended package lead 102*b* of leadframe cell 202*a*) or etch can be used, for example, to cut through the leadframe cell 202 from the bottom of the IC package. At this point, the leadframe strip 200 can be strip tested.

Figure 2F:
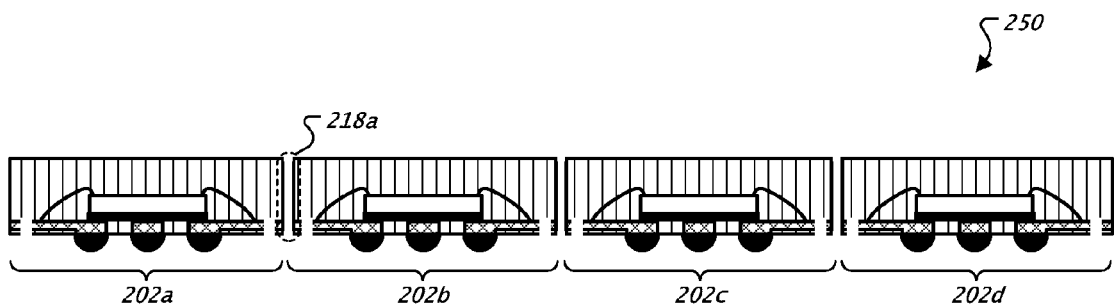

In FIG. 2F, the individual leadframe cells 202 are singulated. A saw cut 218 or punching technique can be used, for example, to separate the individual leadframe cells from the bus bar frame 204 (as shown in FIG. 2A).

Figure 2G:
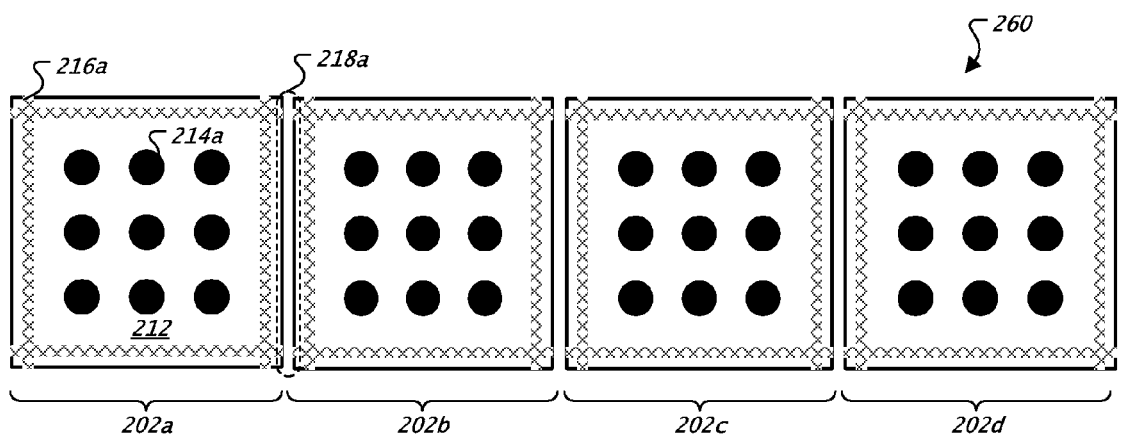

FIG. 2G illustrates a bottom view 260 of the singulated leadframe cells 202. The shallow saw cut 216 and the position of the solder balls 214 contribute to the security of the B/LGA package by providing measures of tamper resistance. The shallow saw cut 216 encompasses the periphery of each leadframe cell 202. Once the leadframe cell 202 is mounted in position (e.g., upon a PCB), signals will not be accessible at the edges for easy tampering. Solder balls 214 are illustrated upon the exposed I/O attach lands. In some implementations (e.g., fabrication of an LGA package), exposed I/O attach lands would not have attached solder balls. Mold compound 212 isolates the signals between the solder balls 214. Because the solder balls 214 are located substantially within the center of the singulated leadframe cells 202, access to those signals upon mounting will be difficult as well. Additional fabrication and/or assembly steps are possible. For example, the leadframe cells 202 can be plated post-assembly before the packages are molded and singulated.

Example Fabrication Process

Figure 3:
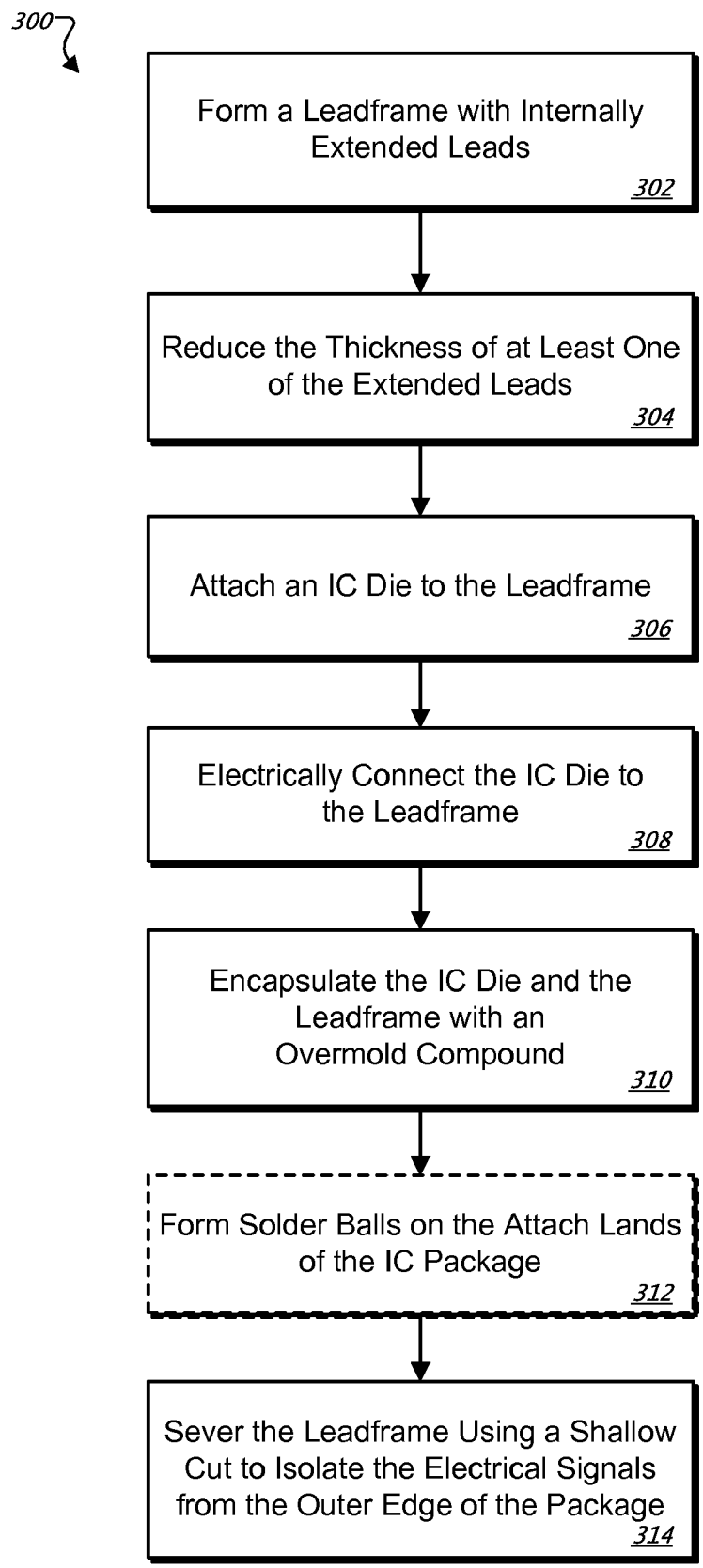
FIG. 3 is a flow diagram illustrating an example process for fabricating and assembling a ball/land grid array package with a secure feature.

FIG. 3 is a flow diagram illustrating an example process 300 for fabricating and assembling a ball/land grid array package with a secure feature. The process 300 begins with forming a leadframe cell, including one or more extended leads which have attach lands and lead ends (302). The attach lands are positioned substantially within the interior of the leadframe cell. In some implementations, the leadframe cell can be fabricated in the pattern of the leadframe cell 100 as shown in FIG. 1A. The leadframe cell, for example, can be created as part of a strip of leadframe cells organized upon a bus bar frame. The bus bar frame provides physical stability to the extension features of the leadframe cell during the assembly process.

At least some extended leads of the leadframe cell have a reduced leadframe thickness (e.g., reduced to about one half the thickness of the leadframe cell) (304). In some implementations, extended leads are etched from the bottom side of the leadframe cell to reduce the thickness. For example, the side view of the strip of leadframe cells 112, as shown in FIG. 1C, illustrates an extended lead 102b which has been reduced in thickness. The attach lands (e.g., attach land 104e as shown in FIG. 1C) remain at full leadframe thickness.

A die is attached to the top of the leadframe cell (306). For example, a non-conductive die-attach paste or film can be applied to the top of the leadframe cell where a die will be mounted, as shown by the die-attach adhesive 210 in FIG. 2B. A die is placed on top of the die-attach adhesive, for example, and cured to the leadframe cell. The die 206 as shown in FIG. 2B, for example, can be mounted on top of the die-attach adhesive 210 and cured to the leadframe cell 202.

The IC die is electrically connected to the leadframe (308). In some implementations, the bond pads of the IC die are electrically connected to the extended package leads by wire bonds (e.g., wire bonds 208 as shown in FIG. 2B) using a standard wire bonding technique and a shortest distance line-of-sight connection. The wire bonds are positioned so that they do not cross adjacent wires or otherwise risk electrical shorting.

The assembled BGA or LGA package is encapsulated with an overmold compound (310). For example, the assembled BGA or LGA package can be coated in an epoxy as shown by the mold compound 212 coating the leadframe strip 200 in FIG. 2C. The mold compound electrically isolates the exposed attach lands from each other by fully coating the leadframe extension features. For example, the mold compound coats the portions of the extended leads which are etched to half thickness (e.g., extended package leads 102g, 102b as illustrated in FIG. 2C), leaving the full thickness attach lands (e.g., attach land 104e as shown in FIG. 2C) exposed at the bottom side of the BGA or LGA package. Since the etched extended leads are covered by the mold compound they cannot be easily probed, thus providing an additional security feature.

Optionally, solder balls are formed on the exposed attach lands of the assembled package (312). For example, solder balls 214 can be formed upon one or more of the attach lands 104 (as shown in FIG. 2D) using a conventional solder ball application technique when fabricating a BGA.

The leadframe is severed using a shallow cut to isolate the electrical signals from the outer edge of the package (314). For example, a shallow saw cut can be placed along the bottom periphery of the leadframe package (e.g., shallow saw cut 216 as shown in FIG. 2G). The shallow saw cut completely severs the leadframe such that the extended portions to the outside of the shallow cut are no longer electrically or physically connected to the leadframe design. The assembled BGA or LGA package can then be singulated, for example, by sawing or punching the individual packages, freeing each package from the bus bar frame. At this point, the package can be mounted, for example, to a printed circuit board by soldering the exposed attach lands of the LGA package or by melting the solder balls of the BGA package. Once the package has been mounted in position, it will be difficult to tamper with the electrical signals provided by the IC die. The peripheral edge is no longer electrically connected to the internal signals, and the attach lands are positioned within the interior of the bottom of the package, making the attach lands difficult to probe.

While this document contains many specific implementation details, these should not be construed as limitations on the scope what may be claimed, but rather as descriptions of features that may be specific to particular embodiments. For example, the geometric proportions of the leadframe cell 100 as described in FIG. 1 are provided by example only and are not intended to limit the potential geometric pattern and/or proportion of a leadframe cell fabricated with extended leadframe design. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made. For example, steps of one or more processes may be combined, deleted, modified, or supplemented to form further processes. As yet another example, the process steps depicted in the figures do not require the particular order shown to achieve desirable results. In addition, other steps may be provided, or steps may be eliminated, from the described processes, and other materials may be added to, or removed from, the described processes. Accordingly, other implementations are within the scope of the following claims.

What is claimed is:

1. A leadframe for an integrated circuit package, comprising:
   a number of internally extended package leads arranged in a plane, each extended package lead being a continuous metal trace electrically isolated from the other extended package leads, the extended package leads having input-output attach lands, the input-output attach lands positioned substantially within the interior of the leadframe, each extended package lead having two lead ends including a first lead end extending along a first axis of the plane and a second lead end extending along a second axis of the plane that is substantially orthogonal to the first axis.

2. The leadframe of claim 1, where at least one extended portion is at least partially etched along a third axis that is substantially orthogonal to the plane to have a thickness less than the leadframe thickness.

3. The leadframe of claim 1, where the leadframe is fabricated using one or more of copper, copper alloy, aluminum, brass and iron-nickel alloy.

4. An integrated circuit package, comprising:
   a leadframe including a number of internally extended package leads arranged in a plane, each extended package lead being a continuous metal trace electrically isolated from the other extended package leads, the extended package leads having input-output attach lands, the input-output attach lands positioned substantially within the interior of the leadframe, each extended package lead having two lead ends including a first lead end extending along first axis of the plane and a second lead end extending along a second axis of the plane that is substantially orthogonal to the first axis; and an integrated circuit die disposed on the leadframe, at least one bond pad of the integrated circuit die electrically coupled to at least one lead end based on a signal layout of the integrated circuit die.

5. The package of claim 4, further comprising:
an overmold encapsulating both the integrated circuit die and at least a portion of the leadframe.

6. The package of claim 5, further comprising:
a trench along a third axis that is substantially orthogonal to the plane which isolates the lead ends from the outer edge of the integrated circuit package.

7. The package of claim 4, where at least one lead end is at least partially etched along a third axis that is substantially orthogonal to the plane to have a thickness less than the leadframe thickness.

8. The package of claim 4, where the leadframe is fabricated using one or more of copper, copper alloy, aluminum, brass and iron-nickel alloy.

9. The package of claim 4, where at least one bond pad of the integrated circuit die is electrically coupled to the at least one lead end using a wire bond.

10. The package of claim 6, where the trench is a shallow saw cut across the lead ends.

11. An integrated circuit package, comprising:
a leadframe including a number of internally extended package leads arranged in a plane, each extended package lead being a continuous metal trace electrically isolated from the other extended package leads, the extended package leads having input-output attach lands, each extended package lead having two lead ends including a first lead end extending along a first axis of the plane and a second lead end extending along a second axis of the plane that is substantially orthogonal to the first axis;
an integrated circuit die disposed on the leadframe, at least one bond pad of the integrated circuit die electrically coupled to at least one lead end based on a signal layout of the integrated circuit die;
an overmold encapsulating both the integrated circuit die and at least a portion of the leadframe; and
a trench along a third axis that is substantially orthogonal to the plane which isolates the lead ends from the outer edge of the integrated circuit package.

12. The package of claim 11, where the trench is a shallow saw cut across the lead ends.

13. An integrated circuit package, comprising:
a leadframe including a number of internally extended package leads arranged in a plane, each extended package lead being a continuous metal trace electrically isolated from the other extended package leads, the extended package leads having input-output attach lands, each extended package lead having two lead ends including a first lead end extending along a first axis of the plane and a second lead end extending along a second axis of the plane that is substantially orthogonal to the first axis, the input-output attach lands positioned substantially within the interior of the leadframe;
an integrated circuit die disposed on the leadframe, at least one bond pad of the integrated circuit die electrically coupled to at least one lead end based on a signal layout of the integrated circuit die; and
a trench along a third axis that is substantially orthogonal to the plane which isolates the lead ends from the outer edge of the integrated circuit package.

14. The package of claim 13, where the trench is a shallow saw cut across the lead ends.

15. The package of claim 13, where portions of the leadframe have a thickness that is less than the leadframe thickness at the attach lands.

* * * * *

UNITED STATES PATENT AND TRADEMARK OFFICE
CERTIFICATE OF CORRECTION

PATENT NO. : 8,022,516 B2  Page 1 of 1
APPLICATION NO. : 12/191214
DATED : September 20, 2011
INVENTOR(S) : Ken Lam et al.

It is certified that error appears in the above-identified patent and that said Letters Patent is hereby corrected as shown below:

Column 1, line 6, delete "lead frame" and insert -- leadframe --

Column 6, line 65, in claim 4, after "along" insert -- a --

Signed and Sealed this
Eighth Day of November, 2011

David J. Kappos
*Director of the United States Patent and Trademark Office*